(12) United States Patent
Scocchetti

(10) Patent No.: US 8,330,482 B2
(45) Date of Patent: Dec. 11, 2012

(54) TEST OF ELECTRONIC DEVICES AT PACKAGE LEVEL USING TEST BOARDS WITHOUT SOCKETS

(75) Inventor: Fabrizio Scocchetti, Cannaiola di Trevi (IT)

(73) Assignee: Eles Semiconductor Equipment S.p.A., Todi (IT)

( * ) Notice: Subject to any disclaimer, the term of this patent is extended or adjusted under 35 U.S.C. 154(b) by 274 days.

(21) Appl. No.: 12/527,418

(22) PCT Filed: Feb. 14, 2008

(86) PCT No.: PCT/EP2008/051791
§ 371 (c)(1),
(2), (4) Date: Dec. 28, 2009

(87) PCT Pub. No.: WO2008/098987
PCT Pub. Date: Aug. 21, 2008

(65) Prior Publication Data
US 2010/0141287 A1    Jun. 10, 2010

(30) Foreign Application Priority Data

Feb. 14, 2007  (EP) ..................................... 07102397
Feb. 19, 2007  (EP) ..................................... 07102650

(51) Int. Cl.
*G01R 31/00* (2006.01)
(52) U.S. Cl. .......... 324/756.07; 324/754.16; 324/750.03
(58) Field of Classification Search ............. 324/754.16, 324/757.01, 750.03, 756.07
See application file for complete search history.

(56) References Cited

U.S. PATENT DOCUMENTS 3,596,228 A * 7/1971 Reed et al. .................... 439/513
4,617,824 A   10/1986 Cybulski et al.
4,820,976 A    4/1989 Brown
(Continued)

FOREIGN PATENT DOCUMENTS

EP    1959262    8/2008
(Continued)

OTHER PUBLICATIONS

English Translation of Foreign Doc JP 11118875A.*
(Continued)

*Primary Examiner* — Arleen M Vazquez
(74) *Attorney, Agent, or Firm* — Graybeal Jackson LLP

(57) ABSTRACT

An embodiment test system is proposed; the test system is used to test electronic devices each one having a case with a plurality of terminals for example, of the BGA type. The test system includes a set of (one or more) test boards. Each test board includes a plurality of banks of electrically conductive receptacles, each one for resting a corresponding electronic device; each receptacle is adapted to receive a terminal of the corresponding electronic device. A set of (one or more) boxes is arranged in operation above the test boards. Each box defines an expandable chamber for a conditioning fluid; particularly, the box includes a rigid body, a flexible membrane of a thermally conductive material facing the test boards, an inlet, and an outlet. Means is provided for controlling a temperature of the conditioning fluid (for example, a heat exchanger). The test system further includes means for forcing the conditioning fluid to circulate under pressure through the chambers, so as to expand the flexible membranes downwardly; the expanded flexible membranes press the electronic devices against the test boards to lock the electronic devices mechanically on the test boards and to condition the electronic devices thermally.

20 Claims, 11 Drawing Sheets

U.S. PATENT DOCUMENTS

| | | | |
|---|---|---|---|
| 5,500,605 A | | 3/1996 | Chang |
| 5,523,696 A | * | 6/1996 | Charlton et al. ......... 324/754.13 |
| 5,550,482 A | | 8/1996 | Sano |
| 5,604,446 A | * | 2/1997 | Sano ....................... 324/754.16 |
| 5,808,474 A | | 9/1998 | Hively et al. |
| 5,952,840 A | | 9/1999 | Farnworth et al. |
| 6,005,401 A | | 12/1999 | Nakata et al. |
| 6,163,145 A | * | 12/2000 | Yamada et al. ......... 324/750.03 |
| 6,204,681 B1 | | 3/2001 | Nagatsuka et al. |
| 6,233,184 B1 | | 5/2001 | Barth et al. |
| 6,317,647 B1 | | 11/2001 | Akaike et al. |
| 6,320,398 B1 | * | 11/2001 | Ito et al. ................... 324/756.02 |
| 6,445,203 B1 | | 9/2002 | Yamashita et al. |
| 6,456,062 B2 | * | 9/2002 | Yamashita et al. ....... 324/757.01 |
| 6,468,098 B1 | | 10/2002 | Eldridge |
| 6,590,381 B1 | | 7/2003 | Iino et al. |
| 6,774,661 B1 | | 8/2004 | Tustaniwskyj |
| 6,798,224 B1 | | 9/2004 | Hembree et al. |
| 7,119,531 B2 | * | 10/2006 | Sakata ..................... 324/754.16 |
| 7,939,945 B2 | * | 5/2011 | Sauciuc et al. ................ 257/774 |
| 2002/0003432 A1 | | 1/2002 | Leas et al. |
| 2002/0030501 A1 | | 3/2002 | Ohtaki |
| 2002/0093352 A1 | | 7/2002 | Min et al. |
| 2002/0197895 A1 | | 12/2002 | Eldridge |
| 2004/0019452 A1 | | 1/2004 | Song et al. |
| 2004/0056649 A1 | | 3/2004 | Sherman |
| 2004/0070416 A1 | | 4/2004 | Saito et al. |
| 2004/0164295 A1 | | 8/2004 | Johnson |
| 2005/0030007 A1 | | 2/2005 | Sakata |
| 2006/0017451 A1 | * | 1/2006 | Akram et al. ................. 324/755 |
| 2007/0288823 A1 | * | 12/2007 | Di Stefano et al. ........... 714/742 |
| 2008/0018353 A1 | * | 1/2008 | Thamarayoor ............... 324/765 |
| 2010/0141288 A1 | | 6/2010 | Di Lello |

FOREIGN PATENT DOCUMENTS

| | | |
|---|---|---|
| JP | 11118875 A * | 4/1999 |
| WO | 0104643 | 1/2001 |
| WO | 2004008163 | 1/2004 |
| WO | 2006066620 | 6/2006 |
| WO | 2008098986 | 8/2008 |

OTHER PUBLICATIONS

International Search Report for International Application Serial No. PCT/EP2008/051790, European Patent Office, May 30, 2008.

International Search Report for International Application Serial No. PCT/EP2008/051791, European Patent Office, Oct. 7, 2008.

European Search Report for Application No. EP07102650, European Patent Office, Berlin, Aug. 7, 2007, pp. 5.

* cited by examiner

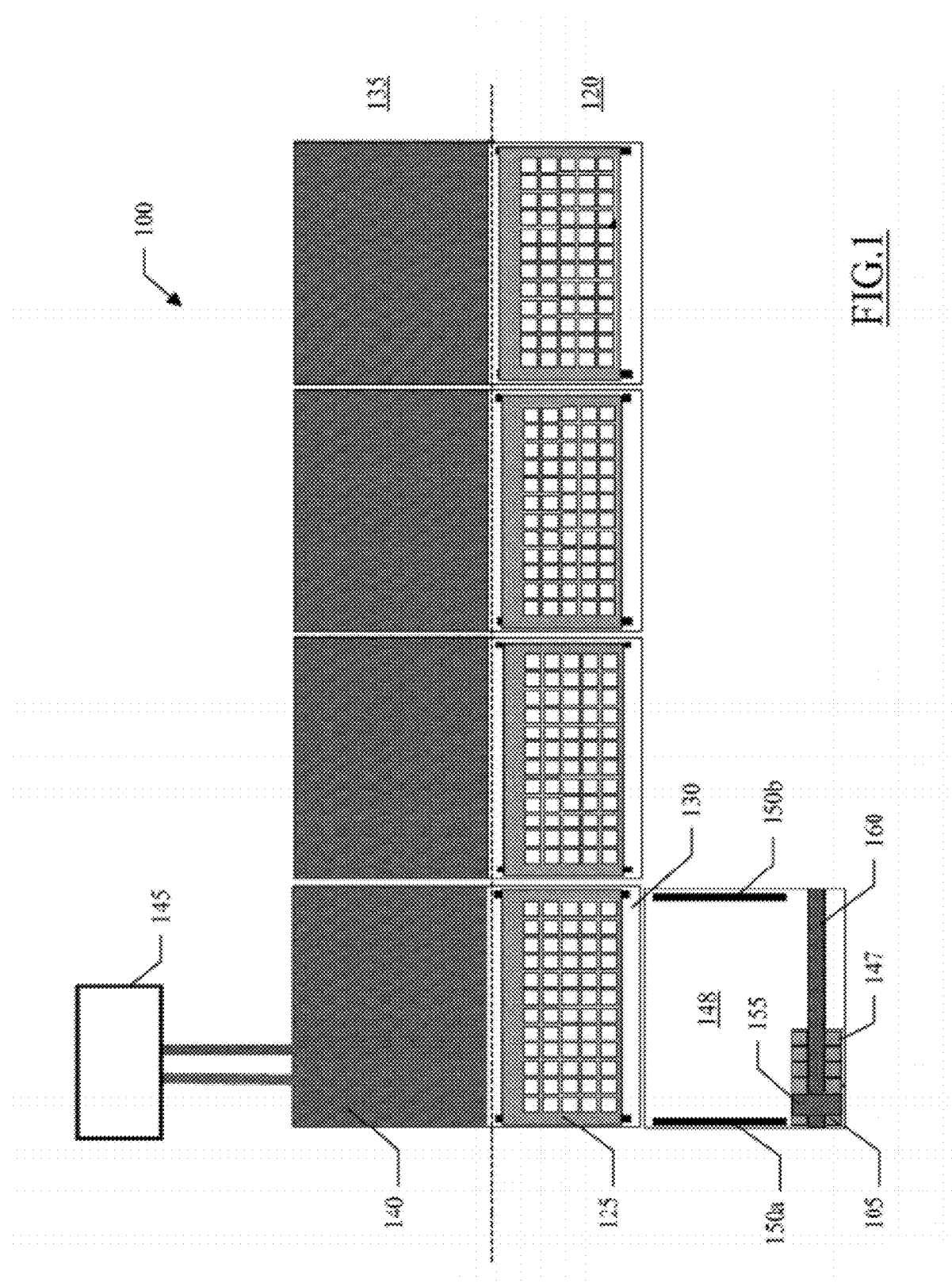

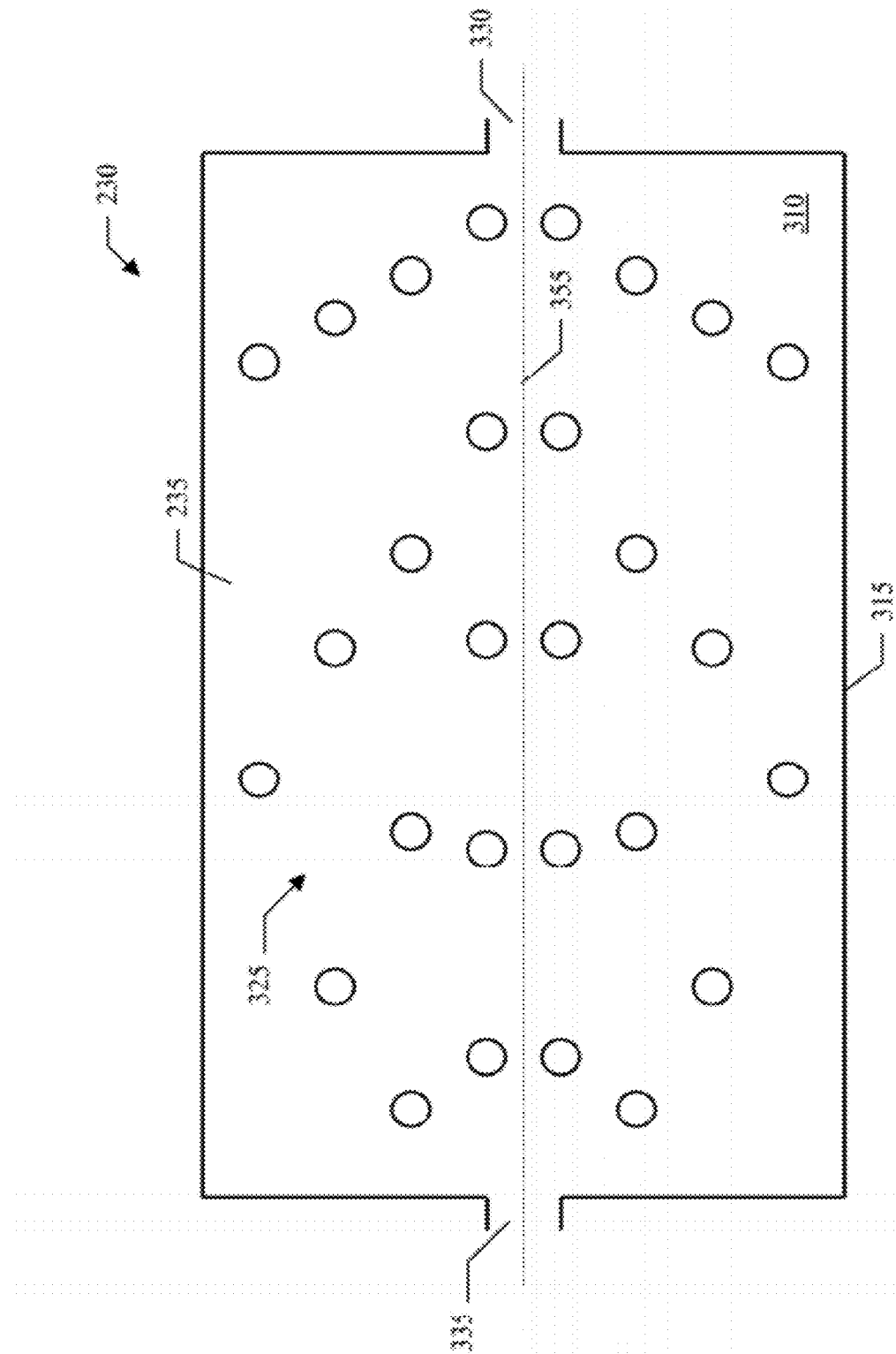

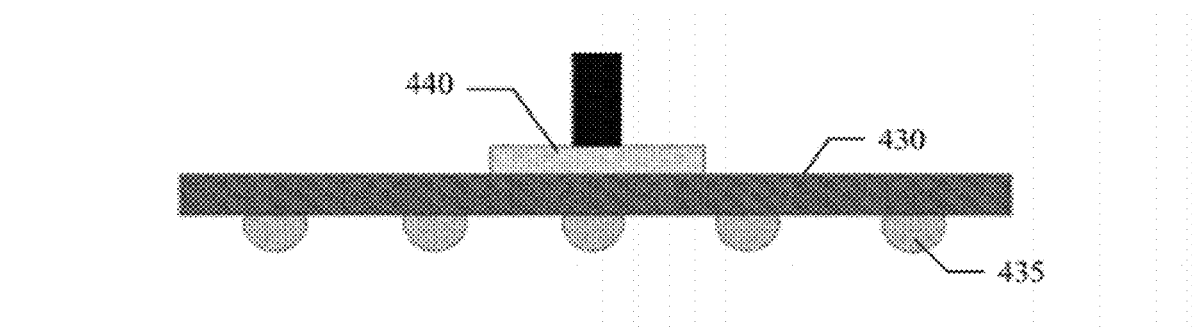
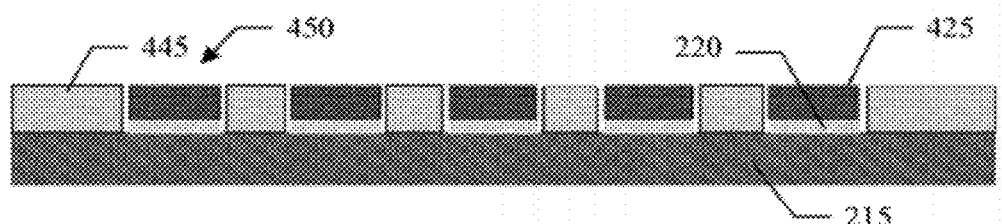
FIG.4C
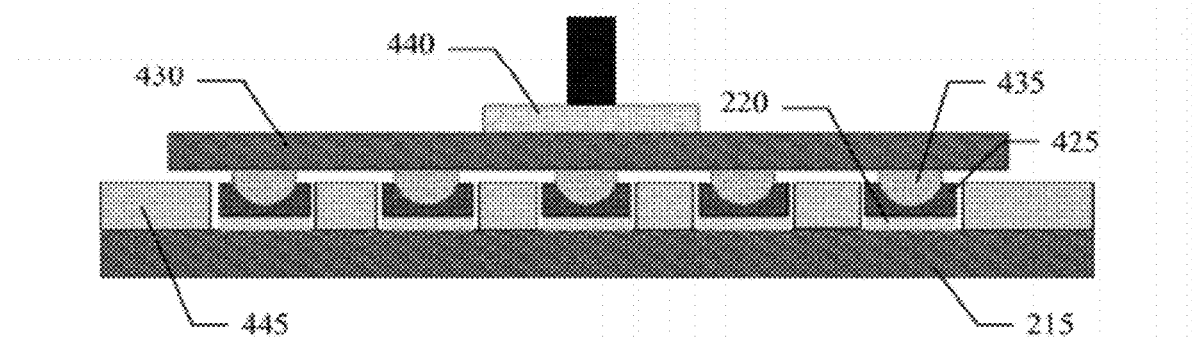
FIG.4D

TEST OF ELECTRONIC DEVICES AT PACKAGE LEVEL USING TEST BOARDS WITHOUT SOCKETS

PRIORITY CLAIM

The present application is a national phase application filed pursuant to 35 USC §371 of International Patent Application Ser. No. PCT/EP2008/051791, filed Feb. 14, 2008; which further claims the benefit of European Patent Applications 07102397.2, filed Feb. 14, 2007 and 07102650.4, filed Feb. 19, 2007; all of the foregoing applications are incorporated herein by reference in their entireties.

RELATED APPLICATION DATA

This application is related to U.S. patent application Ser. No. 12/527,420 entitled TESTING INTEGRATED CIRCUITS ON A WAFER USING A CARTRIDGE WITH PNEUMATIC LOCKING OF THE WAFER ON A PROBE CARD, filed on Aug. 14, 2009, and which is incorporated herein by reference in its entirety.

TECHNICAL FIELD

An embodiment of the present invention relates to the test field. More specifically, an embodiment of the present invention relates to the test of electronic devices.

BACKGROUND

Electronic devices (typically including one or more integrated circuits) are generally subjected to a test process in order to verify their correct operation; this is of the utmost importance to ensure high quality of a manufacturing cycle of the electronic devices. The test can be aimed at identifying defects that are either evident or potential (i.e., which might occur after a short period of use). At the same time, the integrated circuits under test may be conditioned thermally (so as to ensure that they work at a predetermined temperature). A typical example is the burn-in test, which consists of making the electronic devices work for some hours at very high or very low temperature (for example, ranging from −50° C. to +150° C.); in this way, it is possible to simulate a long period of operation of the same electronic devices at room temperature (i.e., 25° C.-50° C.).

The test may be performed either at the wafer level or at the package level. In the first case, the integrated circuits are tested directly—when they are still included in a wafer of semiconductor material; conversely, in the second case the electronic devices are tested once their manufacture is complete (i.e., the integrated circuits have been diced and embedded in suitable packages). The test at the package level reduces the risks of damages to the integrated circuits (for example, due to atmospheric contaminations or shocks); moreover, it allows testing the electronic devices in their actual final form.

The test of the electronic devices at the package level requires that they should be mounted on test boards, which are used to interface the electronic devices with a test system. For this purpose, each test board is provided with multiple sockets. The sockets lock the electronic devices mechanically and connect them electrically to the test system; at the same time, the sockets allow removing the electronic devices without any substantial damage after they have been tested.

With reference in particular to electronic devices of the Ball Grid Array, or BGA, type (having terminals in the form of small balls), an example of known test board is disclosed in U.S. Pat. No. 6,204,681, which is incorporated by reference. Particularly, the test board has a plurality of sockets each one with a spring lever mechanism to clamp a corresponding electronic device; an opening throughout the test board is formed at the center of the socket to expose the balls of the electronic device. The test board is overturned and pressed against a test head arranged above it. For each socket, the test head includes a set of contact tips for the balls of the corresponding electronic device (which contact tips are mounted on an anisotropic conductive sheet). Each contact tip ends with resilient petals or with a cup-like portion; in both cases, the contact tip has a radius smaller than the one of the ball that is pressed against it, so as to protect its apex, to scrap any oxidation film, and to collect possible debris.

A different socket for electronic devices of the BGA type is described in U.S. Pat. No. 5,808,474, which is incorporated by reference. In this case, the socket is formed by a rigid base with a detachable lid, which is used to lock a corresponding electronic device that has been inserted into the base. The socket is also provided with a bladder formed by a flexible circuit substrate with a plurality of test contacts; when a pressurized fluid is fed to the interior of the bladder, the flexible circuit substrate is raised so that its test contacts are urged against the corresponding balls of the electronic device. Alternatively, the flexible circuit substrate is mounted on a compressible layer, which likewise urges its test contacts against the balls when it is compressed by the electronic device forced downwards by the lid.

A drawback of the test boards known in the art is that the structure of the sockets is relatively complex. Moreover, their assembling on the test boards requires a number of operations; for example, the sockets are soldered on the test boards or they are snap mounted thereon. In any case, this adversely affects the cost of the test boards, and then of the whole test system.

With reference now to the thermal conditioning of the electronic devices under test, the desired result is generally achieved by forcing hot or cold air towards the test boards. However, this requires a very bulky structure that has a detrimental impact on the size of the test system and on its cost. Moreover, the control of the temperature of the electronic devices so obtained is not completely effective. Particularly, it is very difficult (if not impossible) to obtain a uniform distribution of the temperature throughout the different electronic devices.

Different solutions have instead been proposed for testing electronic devices at the wafer level.

For example, U.S. Pat. No. 6,468,098, which is incorporated by reference, mentions a know solution, wherein the wafer to be tested is supported by a rigid membrane (made of steel) that is welded to a bellow; a fluid is passed through the bellow, so as to press the wafer against a chuck structure disposed above it. The fluid may also be heated or cooled to affect a temperature of the wafer. In order to improve the connection to the wafer, this document instead proposes the use of an expandable chamber that is defined by a flexible wiring layer provided with compliant contacts. After mounting the wafer below the flexible wiring layer, a fluid is introduced into the chamber so as to press the flexible wiring layer into contact with the wafer; as above, the fluid may also be used to control the temperature of the wafer. Alternatively, the wafer may be maintained above the flexible wiring layer by a vacuum chuck, which is also used to control its temperature. In another embodiment described in the same document, the wafer is attached above a flexible layer that forms a chamber for a fluid (having a single port, so that no control of the temperature of the fluid can be implemented). When the fluid is introduced into the chamber, the flexible layer is raised so as to push the wafer against a wiring layer that is attached to a chuck.

Another pneumatic system for establishing and maintaining electrical connection between contacts is described in US-A-2004/0056649, which is incorporated by reference. Particularly, this document proposes the use of a bladder that is enclosed within a fixture. When the bladder is pressurized with a fluid, it exerts a force that creates the desired connection between corresponding contact pads (such as to activate a switch). For example, the bladder may act on contact buttons (integral with it or mounted on a planar plate), or on pads with a dendritic interface. The fluid may also be thermally conductive, so as to provide a heat sink for the connections.

Referring back to the test of the electronic devices at the package level, a further drawback of the solutions known in the art is that the corresponding test process is quite complex. Indeed, the electronic devices to be tested are mounted on the test boards in a dedicated assembling station. The test boards are then moved to the test system for testing the (carried) electronic devices. At the end of the test process, the test boards are returned to the assembling station for removing the (tested) electronic devices. It is now possible to insert the electronic devices that passed the test into trays that will be used for their final shipping. However, the above-described operations (and especially the need of assembling/disassembling the test boards and moving them to and from the test system) add further complexity and increase the length of the test process.

All of the above maintains the overall cost of the test process relatively high; this drawback limits the use of the test process, and accordingly lowers the level of quality and reliability in the manufacturing of the electronic devices.

SUMMARY

In its general terms, an embodiment of the present invention is based or on the idea of using a fluid both to lock mechanically and to condition thermally the electronic devices.

More specifically, an embodiment of the invention provides a test system; the test system is used to test electronic devices each one having a case with a plurality of terminals—for example, of the BGA type. The test system includes a set of (one or more) test boards. Each test board includes a plurality of banks of electrically conductive receptacles, each one for resting a corresponding electronic device; each receptacle is adapted to receive a terminal of the corresponding electronic device. A set of (one or more) boxes is arranged in operation above the test boards. Each box defines an expandable chamber for a conditioning fluid; particularly, the box includes a rigid body, a flexible membrane of a thermally conductive material facing the test boards, an inlet, and an outlet. Means is provided for controlling a temperature of the conditioning fluid (for example, a heat exchanger). The test system further includes means for forcing the conditioning fluid to circulate under pressure through the chambers, so as to expand the flexible membranes downwardly; the expanded flexible membranes press the electronic devices against the test boards to lock the electronic devices mechanically on the test boards and to condition the electronic devices thermally.

In an embodiment of the invention, each box further includes means for increasing a uniformity of the circulation of the conditioning fluid through the chamber.

For example, it is possible to use obstacle elements with a concentration that decreases moving away from an axis between the inlet and the outlet.

In addition or in alternative, the membrane is held integral with a rigid body of the box in a plurality of internal points.

Both the above-mentioned results may be achieved at the same time by means of a plurality of pins, which extend between a bottom surface of the rigid body and the membrane.

As a further enhancement, the receptacles are elastic and include concave recesses matching the terminals.

In an embodiment of the invention, each test board further includes centering means for aligning the terminals of each electronic device with the corresponding receptacles.

The test system may further include means for loading/unloading the electronic devices from/to a shipping tray.

Another embodiment of the invention proposes a test board (with no socket) for use in the test system.

A further embodiment of the invention proposes a corresponding test method.

A still further embodiment of the invention proposes a process for manufacturing this test board (based on the use of a forming tool acting on isles corresponding to the receptacles).

Restraining means may be used to limit an enlargement of the isles.

Furthermore, the same forming tool may also be used to define the centering means.

BRIEF DESCRIPTION OF THE DRAWINGS

At least one embodiment of the invention itself, as well as further features and the advantages thereof, will be best understood with reference to the following detailed description, given purely by way of a non-restrictive indication, to be read in conjunction with the accompanying drawings. In this respect, it is expressly intended that the figures are not necessary drawn to scale and that, unless otherwise indicated, they are merely intended to conceptually illustrate the structures and procedures described herein. Particularly:

FIG. 1 is a pictorial representation of a test system that may be used to implement an embodiment of the invention, FIG. 3B is a plant view of the same press according to another embodiment of the invention, FIGS. 4A-4E show the various stages of a process that may be used to manufacture a test board according to an embodiment of the invention.

DETAILED DESCRIPTION

Figure 2A:
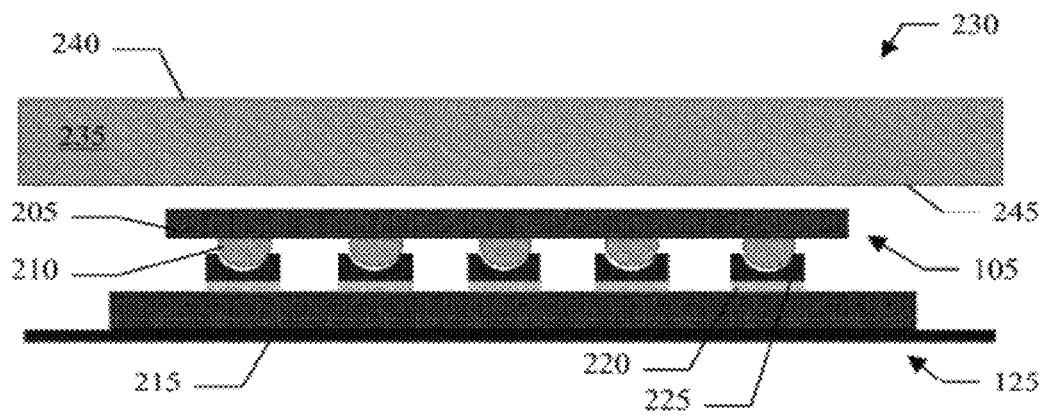
FIGS. 2A-2B illustrate operation of a thermal press of the test system according to an embodiment of the invention.

With reference in particular to FIG. 1, a test system 100 is illustrated. The test system 100 is used to test electronic devices 105 at the package level (i.e., in their final form); for example, the test is of the burn-in type (wherein the electronic devices 105 are tested under thermal stress conditions).

For this purpose, the test system 100 includes a conditioning area 120, which is used to control the temperature of the electronic devices 105 during the burn-in test. Particularly, a plurality of test boards 125—consisting of Burn-In Boards (BIBs) in the example at issue—are arranged in the conditioning area 120. Each burn-in board 125 includes multiple housings each one for receiving an electronic device 105 to be tested (such as with a matrix of housings having 2-10 rows and 5-20 columns). Each burn-in board 125 is coupled with a corresponding thermal press 130 (arranged above it).

The test system 100 is also provided with a control area 135, which is maintained at room temperature; the control area 135 is thermally insulated from the conditioning area 120, with the two areas 120 and 135 that communicate through slots provided with protective seals. Particularly, the control area 135 houses a plurality of driving boards 140. Each burn-in board 125 (when inserted in the conditioning area 120) is connected electrically to a corresponding driving board 140. The driving board 140 includes the circuitry that is used to control the burn-in test of the electronic devices 105 placed on the burn-in board 125; particularly, the driving board 140 provides a power supply and stimulus signals to and receives corresponding result signals from the electronic devices 105. The control area 135 also includes a pneumatic system 145, which is used to control the presses 130 (as it will be apparent in the following).

The electronic devices 105 to be tested are provided in a tray 147 (that will be used for their final shipping). The tray 147 with these electronic devices 105 is moved to a loader/unloader 148, which is placed in front of a (current) burn-in board 125. This burn-in board 125 is extracted from the conditioning area 120; particularly, the burn-in board 125 is disengaged from the corresponding driving board 140, and it is made to slide on a pair of rails 150a and 150b of the loader/unloader 148. A head 155 of the loader/unloader 148 (for example, of the vacuum type) picks up a (current) electronic device 105 from the tray 147. The head 155 is mounted on a bar 160, which slides toward the burn-in board 125 until reaching the row of a target housing (for the electronic device 105). The head 155 then slides along the bar 160 until reaching the column of the target housing. At this point, the head 155 releases the electronic device 105 onto the target housing. The same operations described above are repeated until the burn-in board 125 has been filled up. The burn-in board 125 in then inserted into the conditioning area 120, with the electronic devices 105 resting thereon, so as to return to its original position (coupled with the corresponding driving board 140). The loader/unloader 148 is moved in front of a next burn-in board 125, so as to reiterate the same operations (until all the desired electronic devices 105 have been loaded into the test system 100).

At the end of the test process, the operations described above are repeated in reverse order. Particularly, a (current) burn-in board 125 is extracted from the conditioning area 120 by sliding on the rails 150a and 150b of the loader/unloader 148 (placed in front of it). The head 155 is moved over each electronic device 105 being placed on the burn-in board 125 (by sliding the bar 160 to its row and then sliding the head 155 along the bar 160 until reaching its column). The head 155 picks up the electronic device 105 and returns it to a free location of the tray 147. At this point, the head 155 releases the electronic device 105 onto the tray 147. The same operations described above are repeated until the burn-in board 125 has been emptied. The burn-in board 105 is then returned to the conditioning area 120. The loader/unloader 148 is moved in front of a next burn-in board 125, so as to reiterate the same operations (until all the tested electronic devices 105 have been returned to the tray 147).

Moving now to FIG. 2A, a generic electronic device 105 to be tested includes an integrated circuit being formed in a chip of semiconductor material (not shown in the figure); the chip is embedded in a case 205, which consists of an insulating body protecting the chip from damages. The chip is connected electrically to external terminals 210 of the electronic device 105, which implement any Input/Output (I/O) function of the integrated circuit. In the example at issue, the electronic device 105 is of the BGA type, wherein the terminals 210 consist of a matrix of small balls arranged on a (lower) front surface of the case 205.

On the other hand, the burn-in board 125 is formed by a circuitized insulating substrate 215 (for example, consisting of a printed circuit board with one or more layers of conductive tracks). For each electronic device 105, the burn-in board 125 includes a bank of electrically conductive pads 220 for its terminals 210; the pads 220 are arranged in a matrix on a top surface of the substrate 215 (and they are connected electrically to the tracks of the substrate 215 to route the desired signals). An electrically conductive receptacle 225 is formed on top of each pad 220 for receiving the corresponding terminal 210.

In an embodiment of the present invention, as described in detail in the following, the press 230 is formed by a box that defines an expandable chamber 235. For this purpose, the box 230 includes a rigid body 240 and a flexible membrane 245. The membrane 245 is made of an (elastic) thermally conductive material; for example, the membrane 245 consists of a sheet of silicone (with a thickness of 0.5-2 mm). A conditioning fluid is forced to circulate in the chamber 235 under pressure (through an inlet and an outlet, not shown in the figure); at the same time, the conditioning fluid is warmed and/or cooled (for example, in an external heat exchanger not shown in the figure). The conditioning fluid is selected so as to maintain its state at any working temperature of the test system; a suggested choice for this conditioning fluid is glycol (which supports temperatures ranging from −60° C. to +300° C.).

Figure 2B:
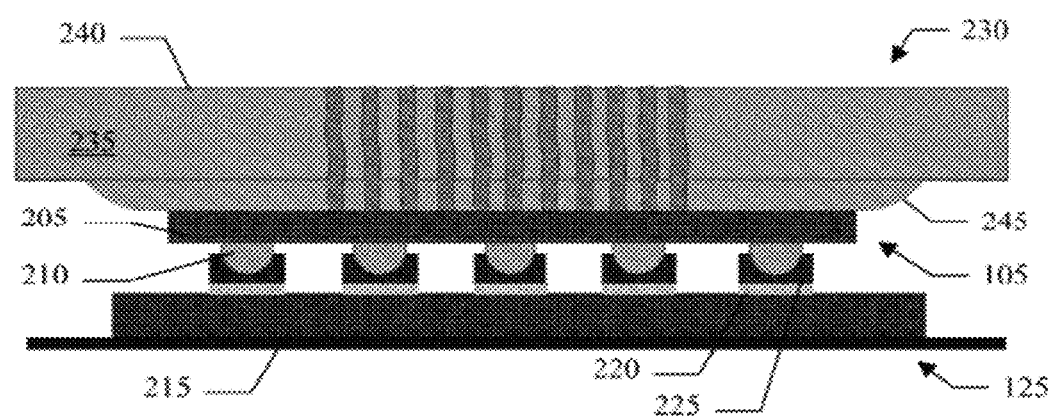

The electronic device 105 is simply resting on the burn-in board 125, and particularly on the corresponding receptacles 225, each one receiving a terminal 210 (without any mechanical lock). Moving to FIG. 2B, when the pressure of the conditioning fluid increases the chamber 235 expands; the membrane 245 then extends downwardly, so as to act on an (upper) back surface of the case 205—without any terminals 210. In this way, the membrane 245 presses the electronic device 105 against the burn-in board 125 (and particularly the terminals 210 into the corresponding receptacles 225). Therefore, the electronic device 105 is locked mechanically with the burn-in board 125; at the same time, this ensures the correct electrical contact between the terminals 210 and the receptacles 225. Moreover, the conditioning fluid applies or absorbs heat to/from the electronic device 105 (through the membrane 245); in this way, the electronic device 105 is conditioned thermally (by warming or cooling it), so as to maintain the electronic device 105 at the desired temperature during the burn-in test.

Conversely, when the pressure of the conditioning fluid decreases the chamber 235 reduces; the membrane 245 then rises, so as not to interfere with the back surface of the case 205 any longer. Therefore, the electronic device 105 is released. This allows removing the electronic device 105 from the burn-in board 125 at the end of the test process without any damage.

The proposed solution strongly simplifies the structure of the burn-in boards (or more generally of any test boards), since they do not have any sockets for locking the electronic devices mechanically; therefore, it is possible to reduce the number of operations required for manufacturing the test boards (without the ones needed for assembling the sockets). This has a beneficial effect on the cost of the test boards, and then of the whole test system. At the same time, the membrane allows compensating any non-planarity of the electronic devices individually (so as to ensure the correct electrical contact with the burn-in board in any condition).

Moreover, the proposed solution avoids the use of any (bulky) conditioning structures based on the hot/cold air in the test system; as a result, the size of the test system—and then its cost as well—is reduced.

Anyway, the devised technique for conditioning the electronic devices thermally is very effective. Particularly, the direct action of the conditioning fluid on the cases allows obtaining a substantially uniform distribution of the temperature throughout the different electronic devices under test.

At the end, as pointed out above, during the test process the electronic devices can be moved only by means of the trays that will be used for their final shipping (with the loader/unloader that is integrated in the test system, without the need of any external assembling station for the test boards). This further simplifies and shortens the test process.

All of the above contributes to reduce the overall cost of the test process; this fosters the widespread diffusion of the test process, with a beneficial effect on the quality and reliability in the manufacturing of the electronic devices.

In the embodiment of the invention described above, the receptacles 225 have a concave shape; moreover, the receptacles 225 are resilient (i.e., they deform elastically under the pressure that is exerted by the electronic device 105). Therefore, it is possible to obtain a self-centering of the (rounded) terminals 210 in the receptacles 225. This facilitates the positioning of the electronic device 105 on the burn-in board 125 (by the above-described 3-axes positioning system of the test system); moreover, it is also possible to prevent any misalignment of the electronic device 105 with respect to the burn-in board 125 (for example, during its insertion into and extraction from the test system).

Figure 3A:
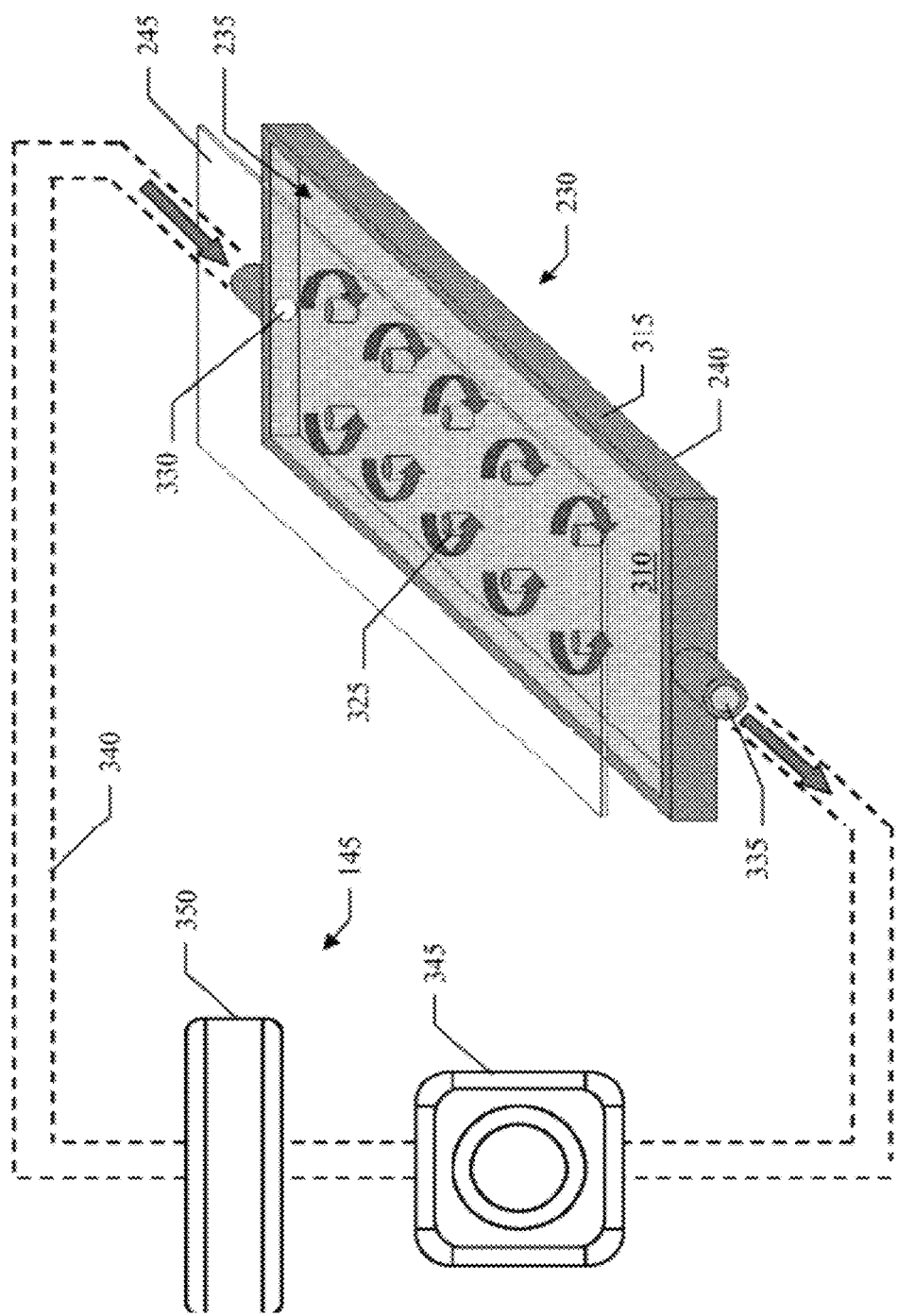
FIG. 3A is an exploded view of this press according to an embodiment of the invention.

Considering now FIG. 3A, the structure of the box 230 (turned upside down for the sake of illustration) is described in greater detail. Particularly, the rigid body 240 of the box is shaped like a tray. The tray 240 has a bottom surface 310 with a rectangular shape; the bottom surface 310 has a size slightly larger than the one of the corresponding burn-in board (for example, 10-30 cm×30-50 cm). Four sidewalls 315 extend perpendicularly from a border of the bottom surface 310 (for example, with a height of 1-3 cm). The flexible membrane 245 closes the tray 240 (so as to define the chamber 235); particularly, the membrane 245 is fastened to the tray 240 along a free border of the sidewalls 315. Preferably, a matrix of pins 325 projects upwards from the bottom surface 310 (being distributed uniformly inside its border); the pins 325 have the same height of the sidewalls 315 (1-3 cm in the example at issue). The membrane 245 is further fastened to a free end of each pin 325. In this way (when the pressure in the chamber 235 increases) the membrane 245 cannot rise in the points wherein the pins 325 hold it. Therefore, the membrane 325 expands approximately in the same way throughout its whole extent; this provides a more uniform distribution of the pressure that is applied to the electronic devices. At the same time, the pins 325 distribute the circulation of the conditioning fluid through the chamber 235 (as shown schematically by the arrows in the figure). As a result, the (fresh) conditioning fluid at the desired temperature reaches the whole chamber 235, so as to increase the uniformity of the thermal conditioning of the electronic devices under test.

An inlet 330 (for the conditioning fluid) is opened in the sidewall 315 extending from one of the shorter edges of the bottom surface 310; a corresponding outlet 335 is opened in the opposed sidewall 315 (extending from the other shorter edge of the bottom surface 310). A duct 340 defines a hydraulic circuit that connects the chamber 235 (through its inlet 330 and outlet 335) to the pneumatic system 145 of the test system. Particularly, the pneumatic system 145 includes a pump 345, which sucks the conditioning fluid from the chamber 235 through the outlet 335. The pump 345 forces the conditioning fluid towards a heat exchanger 350. The heat exchanger 350 warms or cools the conditioning fluid according to the required temperature (for the electronic devices); the conditioning fluid is then injected into the chamber 235 with the required pressure (for controlling the volume of the chamber 235) through the inlet 330. In this way, the conditioning fluid flows continuously through the pump 345, the heat exchanger 350 and the chamber 235.

This allows applying the desired pressure and maintaining the desired temperature in a very simple and effective way. For example, it is possible to use the same conditioning fluid for all the boxes of the test system. Alternatively, a distinct hydraulic circuit may be provided for each box (or group thereof), so as to control the temperature of its conditioning fluid individually.

Alternatively, as shown in FIG. 3B, the pins 325 are not distributed uniformly throughout the bottom surface 310 of the box 230. Particularly, a concentration of the pins 325 decreases moving away from an axis 355 between the inlet 330 and the outlet 335. In this way, the pins 325 act as obstacles for the (natural) circulation of the conditioning fluid along its preferred path (directly from the inlet 330 to the outlet 335). Therefore, the conditioning fluid is forced to circulate at the periphery of the box 230 as well (close to its sidewalls 315). As a result, it is possible to obtain a substantially uniformity in the circulation of the conditioning fluid through the chamber 235 (and then a substantial uniformity in the thermal conditioning of the electronic devices).

The various stages of a process that may be used to manufacture the above-described burn-in board are illustrated in FIGS. 4A-4E.

Figure 4A:
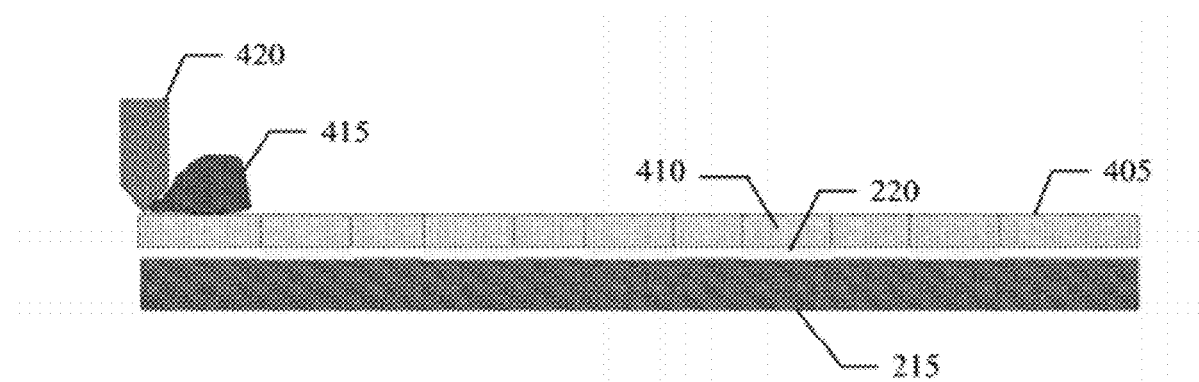

Considering in particular FIG. 4A, the process starts with the substrate 215; the pads 220 are formed on the top surface of the substrate 215—in the positions corresponding to the terminals of the electronic devices to be tested—by means of conventional photolithographic techniques (for example, by depositing a layer of Aluminum that is then etched selectively).

A precursor material required to create the desired receptacles is distributed on the pads 220 by means of a silk-screen printing operation. For this purpose, a stencil 405 is placed on the substrate 215. The stencil 405 includes a matrix of windows 410 corresponding to the pads 220. A polymer 415 is then applied on the pads 220—through the stencil 405—by means of a knife 420; the polymer 415 consists of a material that is electrical conductive and deformable (such as the commercial product "Loctite 3880" by Loctite Corp.).

Figure 4B:
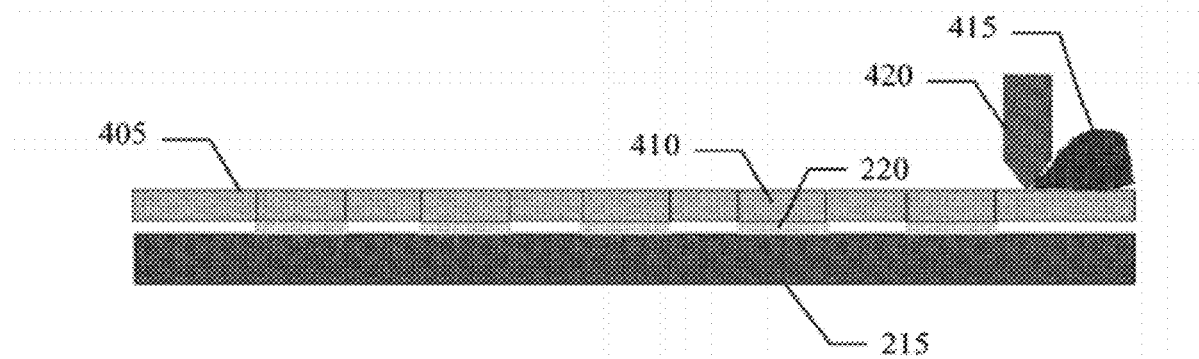

As shown in FIG. 4B, this result is achieved by making the knife 420 cross the whole stencil 405; in this way, the polymer 415 is pushed into the windows 410.

Moving to FIG. 4C, when the stencil is removed an isle 425 of the polymer remains on each pad 220. The isles 425 are then shaped—according to the terminals of the electronic devices to be tested—by means of a forming tool 430. For this purpose, a bottom surface of the forming tool 430 is provided with a matrix of dummy elements 435 mimicking the terminals of one or more electronic devices; the forming tool 430 may consist of either a dummy component or a sample of the electronic devices. The forming tool 430 is mounted on a pick and place head 440; the head 440 is controlled by means of an optical system, such as of the laser or infrared type (not shown in the figure), which allows aligning the dummy elements 435 correctly with the isles 425.

A restraining stencil 445 may also be placed on the substrate 215. The stencil 445 includes a matrix of windows 450 corresponding to the isles 425. Each window 450 has the same shape as the corresponding isle 425, but it is slightly larger. In this way, an empty channel is formed around the isle 425 (between it and the stencil 445); this channel may have a width ranging from 50 µm to 250 µm, for example, from 100 µm to 200 µm, such as 150 µm.

At this point, the head 440 is lowered so as to press the forming tool 430 against the substrate 215 (see FIG. 4D). Therefore, the dummy elements 435 act as a die that presses the isles 425 accordingly; the isles 425 are then shaped as a negative of the dummy elements 435 (and then of the terminals of the electronic devices). The same operation is repeated (if it is necessary) until all the isles 425 of the test board have been shaped.

In this phase, the pressure that is exerted by each dummy element 435 on the corresponding isle 425 may also enlarge it. However, at most the isle 425 can expand by the width of the channel that is formed around it by the stencil 445. In this way, the stencil 445 limits the extent of the enlargement of the isles 425. This prevents adjacent isles 425 to come into contact (thereby creating short-circuits that would impair operation of the resulting burn-in board). Moreover, it is now possible to use any desired material for forming the isles 425 (for example, with a very high conductivity), even if it is too deformable.

Figure 4E:
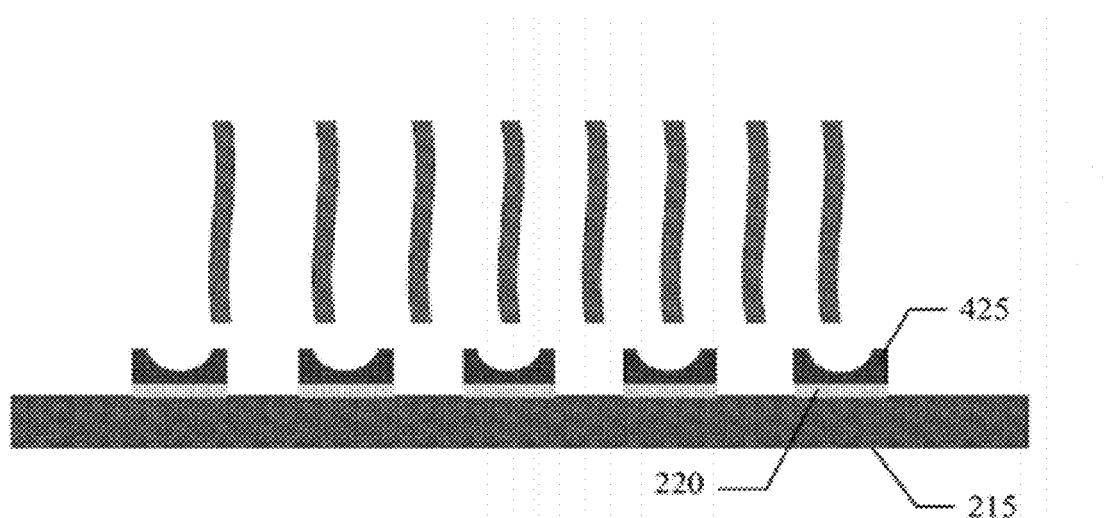

Moving to FIG. 4E, the head is raised and the forming tool is removed (together with the restraining stencil, if it is present). The structure so obtained is now passed in an oven (for example, at 125-200° C. for 10-30 min.), so as to polymerize the material forming the (shaped) isles 425. In this way, the isles 425 harden to provide the desired receptacles for the terminals of the electronic devices.

Figure 5A:
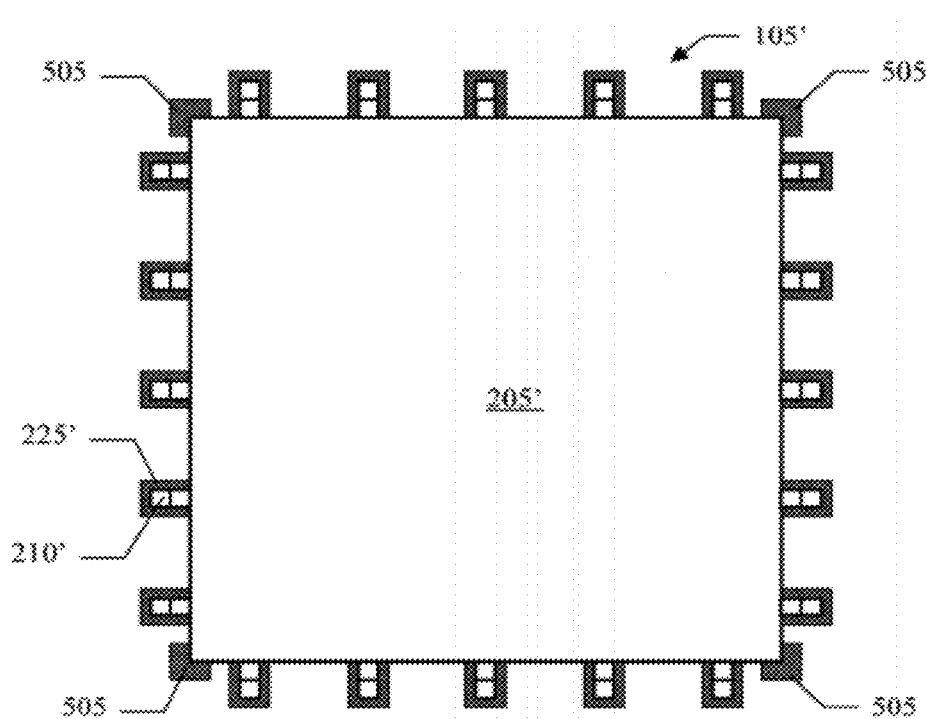
FIGS. 5A-5B illustrate the application of an embodiment of the invention to a different type of electronic devices.
Figure 5B:
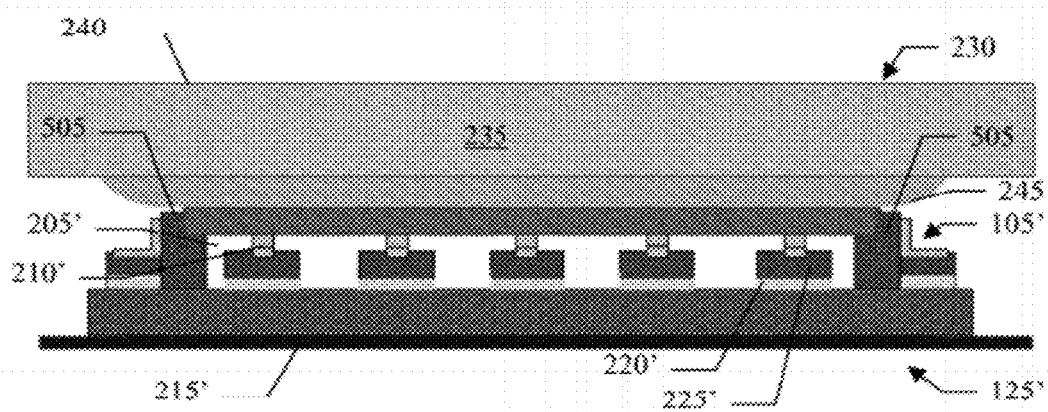

The application of an embodiment to different electronic devices is illustrated in FIG. 5A and FIG. 5B (from now on, the elements corresponding to the ones of the preceding figures will be differentiated by means of a prime notation). Particularly, the figures show a generic electronic device 105' of the Quad Flat Package (QFP) type. In this case, the electronic device 105' has a case 205' with terminals 210' that extend from each one of its four sides; the terminals 210' are of the Gull Wing type (i.e., they consist of leads extending horizontally, which are bent downwards and then outwards so as to define a flat contact for the surface mounting of the electronic device 105').

The burn-in board 125' is again formed by a circuitized insulating substrate 215' with a matrix of conductive pads 220'. A conductive receptacle 225' is formed on top of each pad 220' for receiving the corresponding terminal 210'. In this case, each receptacle 225' includes a print that matches the flat contact of the terminal 210'. Four centering towers 505 may be further formed on the top surface of the substrate 215'. The centering towers 505 are higher than the receptacles 225', so as to reach the case 205' (when its terminals 210' rest on the receptacles 225'). The centering towers 505 are arranged at the four corners of the case 205'; each centering tower 505 has an internal depression for receiving the corresponding corner of the case 205'. The centering towers 505 facilitate the positioning of the electronic device 105' on the burn-in board 125' and prevent any misalignment between them (even in this case wherein the terminals 210' are not self-centering).

As above, when the chamber 235 expands the membrane 245 acts on a back surface of the case 205', so as to press the terminals 210' against the corresponding receptacles 225' (at the same time warming or cooling the electronic device 105'); moreover, the case 205' interferes with the centering towers 505, which maintain the electronic device 105' in the desired position. Conversely, when the chamber 235 reduces the electronic device 105' is released.

The various stages of a process that may be used to manufacture the above-described burn-in board are illustrated in FIGS. 6A-6E.

Figure 6A:
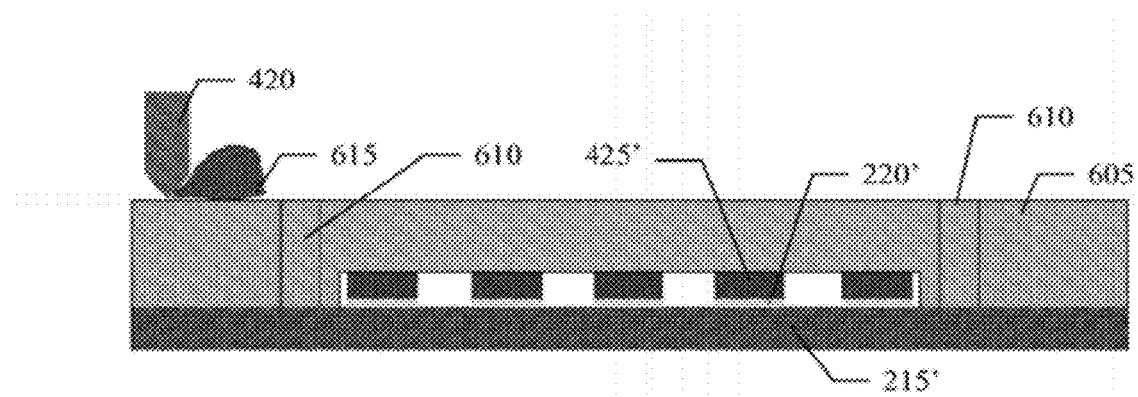
FIGS. 6A-6E show the various stages of a process that may be used to manufacture a test board according to another embodiment of the invention.

Considering in particular FIG. 6A, the same operations described above are repeated to form the pads 220' on the top surface of the substrate 215'; likewise, corresponding isles 425' (of the same electrical conductive and deformable material) are created on the pads 220' by means of a silk-screen printing operation. A further silk-screen printing operation is now carried out to distribute a precursor material required to create the centering towers on the substrate 215'. For this purpose, a stencil 605 is placed on the substrate 215'. The stencil 605 is thicker that the one used to create the isles 425', and it is provided with foots for spacing it from the isles 425' (so as to avoid damaging them); the stencil 605 includes four windows 610 at the corners of the matrix of pads 220' (only two shown in the figure). A polymer 615 is then applied on the substrate 215'—through the stencil 605—by means of the same knife 420; the polymer 615 consists of a deformable material (either conductive or insulating), such as the same being used to form the isles 415'.

Figure 6B:
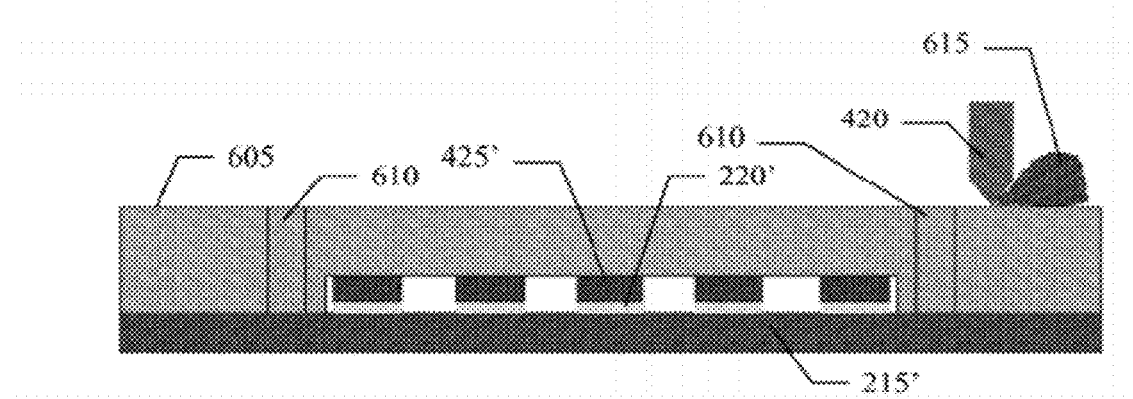

As above, see FIG. 6B, this result is achieved by making the knife 420 cross the whole stencil 605; in this way, the polymer 615 is pushed into the windows 610.

Figure 6C:
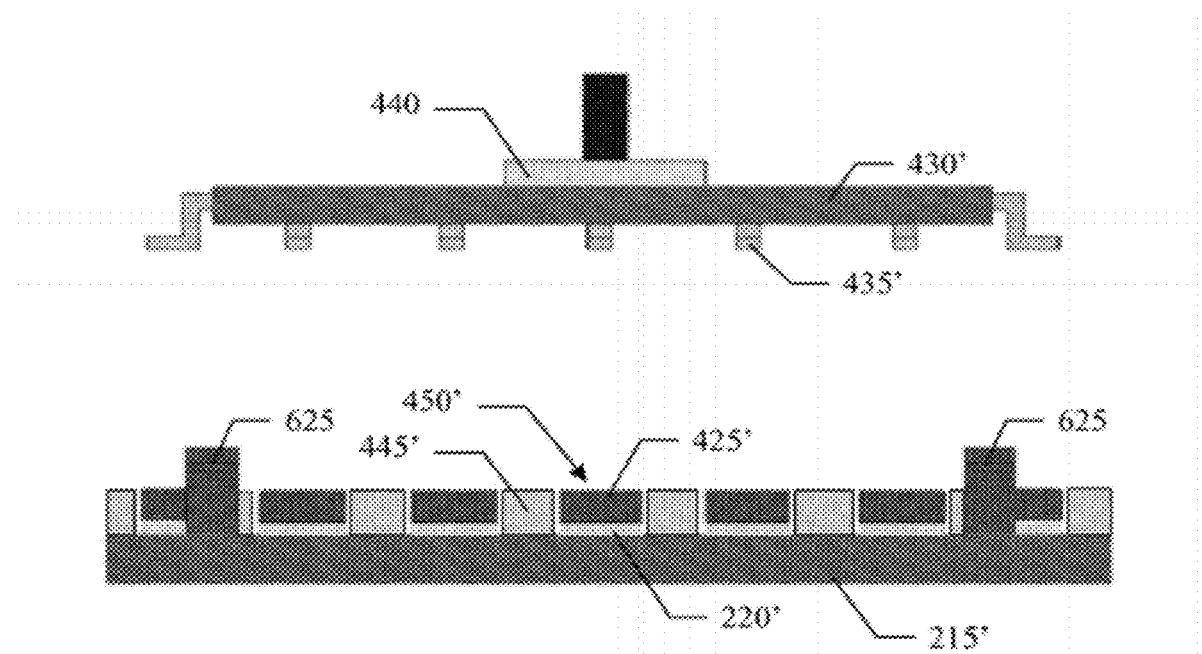

Moving to FIG. 6C, when the stencil is removed four columns 625 of the polymer remains on the substrate 215'. The isles 425' and the columns 625 are then shaped—according to the electronic devices to be tested—by means of a forming tool 430'. The forming tool 430' has a main body corresponding to the case of one ore more electronic devices; dummy elements 435' extend from each one of the four sides of the main body of the forming tool 430', so as to mimic the terminals of the electronic devices. The forming tool 430' is mounted on the same head 440 as above. In this case as well, a restraining stencil 445' (with windows 450' slightly larger than the isles 425') may be placed on the substrate 215.

Figure 6D:
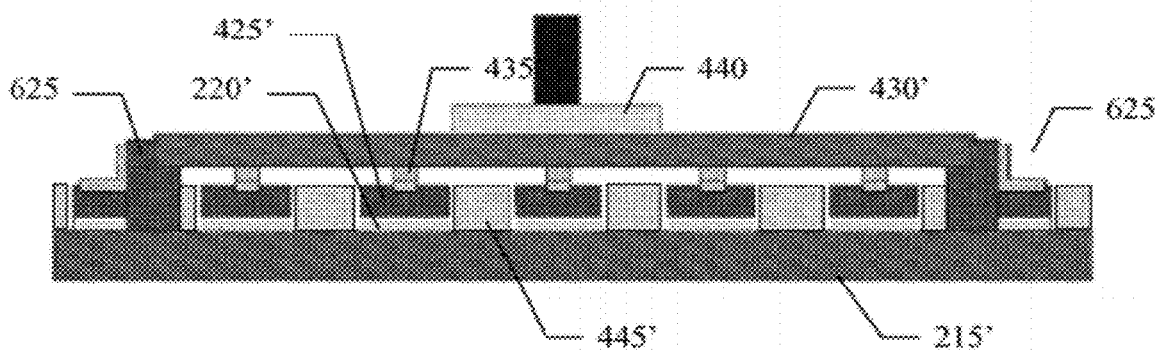

At this point, the head 440 is lowered so as to press the forming tool 430' against the substrate 215 (see FIG. 6D). Therefore, the dummy elements 435' act as a die that presses the isles 425' accordingly (shaping them as a negative of the dummy elements 435', and then of the terminals of the electronic devices); as above, the stencil 445' limits any enlargement of the isles 425'. At the same time, each corner of the main body of the forming tool 430' prints an internal portion of the corresponding column 625.

Figure 6E:
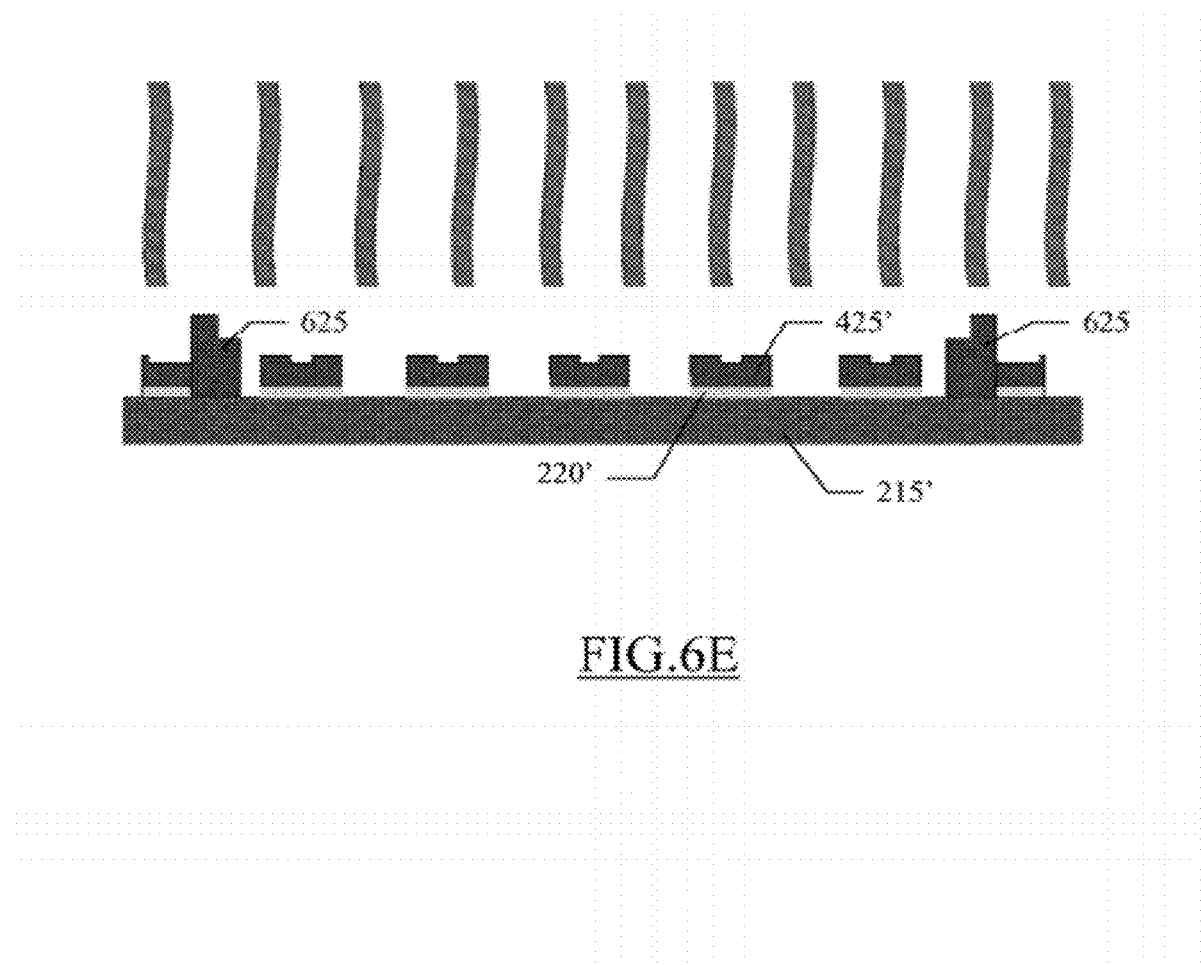

Moving to FIG. 6E, the head is raised and the forming tool is removed (together with the restraining stencil, if it is present). The structure so obtained is again passed in an oven, so as to polymerize the material forming the (shaped) isles 425' and columns 625. In this way, the isles 425' and the columns 625 harden to provide the desired receptacles and centering towers, respectively, for the electronic devices.

Naturally, in order to satisfy local and specific requirements, a person skilled in the art may apply to the at least one embodiment described above many logical and/or physical modifications and alterations. More specifically, although at least one embodiment of the present invention has been described with a certain degree of particularity, it should be understood that various omissions, substitutions and changes in the form and details as well as other embodiments are possible. Particularly, the proposed solution may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any disclosed embodiment of the invention may be incorporated in any other embodiment as a matter of general design choice.

Particularly, similar considerations apply if the test system has a different structure or includes equivalent components. More generally, the test system may be used to carry out whatever test process, which requires conditioning the electronic devices thermally in the broadest acceptation of the term. For example, in addition to the above-mentioned burn-in test, the concepts of the present disclosure may also be applied to a reliability test during a preliminary development stage of the electronic devices. In this case, it is possible to test small batches of the electronic devices (down to the ones housed on a single test board); the test may even be carried out at different temperatures, thanks to the capability of conditioning each test board individually. Another example is that of a functional test or a parametric test (which may even be performed concurrently with the burn-in test in the same test system). Moreover, as described above, the electronic devices may be tested under electrical and/or environmental stress conditions (for example, by forcing specific thermal cycles); alternatively, it is possible to maintain the temperature of the electronic devices under test simply at a predetermined value (for example, the room temperature).

Moreover, an embodiment lends itself to be applied to any type of electronic devices (for example, of the optical type, based on discrete components, and so on). Moreover, the electronic devices may be provided in different packages (for example, of the Dual-In-Line type), or they may have equivalent terminals (for example, of the J-type).

Similar considerations apply if the test system is adapted to receive a different number of burn-in boards (down to a single one); likewise, the test system may include any number of boxes (for example, with each box that is associated with multiple burn-in boards—down to a single box for all the burn-in boards).

Each box (i.e., its rigid body and membrane) may have a different shape and/or size; moreover, it is possible to have any other inlet and/or outlet for the conditioning fluid (in whatever position). Likewise, the membrane may be made with another thickness, or with any other elastic and thermally conductive material (for example, rubber).

Nothing prevents replacing the conditioning fluid with any other liquid or gas (such as air). Alternatively, it is possible to implement an equivalent hydraulic circuit (even with different components) for controlling the pressure and the temperature of the conditioning fluid (with or without any feedback).

The distribution of the conditioning fluid through the chamber may be achieved with equivalent means; for example, it is possible to use ribs extending from the bottom surface of the box (such as in a radial arrangement), or any other obstacle elements for the conditioning fluid.

The above-described arrangement of the pins is merely illustrative, and is not to be interpreted in a limitative manner. For example, nothing prevents arranging the pins (with decreasing concentration) along rays extending from the inlet of the box.

Similar considerations apply if the result of holding the membrane integral with the rigid body of the box in multiple internal points is achieved with equivalent structures (for example, by means of a grille).

In any case, it is possible to implement the distribution of the conditioning fluid and the holding of the membrane independently (for example, with longer pins distributed uniformly for holding the membrane, and shorter pins that do not reach the membrane for distributing the conditioning fluid).

However, the above-described additional features are not strictly necessary, and each one or even both of them may be omitted in a simplified implementation of the box.

An embodiment lends itself to be implemented with equivalent receptacles for receiving the terminals of the electronic devices electrically (even made of a material that is not elastic).

The terminals of each electronic device may be aligned with the corresponding receptacles by means of one or more equivalent centering elements (for example, a frame). Moreover, nothing prevents applying the same embodiment to the burn-in board with the concave receptacles as well; vice-versa, the removal of the centering towers from the burn-in board with the flat receptacles is contemplated.

Alternatively, the boxes may be raised/lowered to decouple/couple them with the test boards, the same operations may be performed in opposite directions on the test boards (in addition or in alternative), the loader/unloader may move the electronic devices between the tray and the test boards (decoupled from the boxes) directly in the conditioning area, and the like.

Naturally, the burn-in board (or more generally, any test board without socket) may have a different structure, it may include equivalent elements, or it may house any number of electronic devices to be tested. In any case, the test board may be suitable to be manufactured and put on the market even as a stand-alone product (for use in the above-described test system). In any case, the possibility of adding some sort of mechanical system (to clock the electronic devices in specific situations) is not excluded.

Similar considerations apply if the proposed test board is manufactured with an equivalent process (by using similar steps, removing some steps being not essential, or adding further optional steps—even in a different order). For example, it is possible to use any other material being deformable and electrically conductive for forming the receptacles of the test board (such as another epoxy resin), the polymer may be shaped and hardened in a different way (for example, by means of a hot-pressing step), or the isles on the pads may be formed with another technique (for example, by depositing a layer of polymer and then removing it selectively).

Alternatively, the channels defined around the isles by the restraining stencil may have a different width; moreover, the same result may be achieved with any other equivalent means, even adapted to remain on the burn-in board (for example, a mesh, insulating bushes, and the like). In any case, this step may be also omitted at all (such as when the material being used for forming the isles is not too deformable, or the isles are largely spaced apart).

The same remarks as above apply to the operations required to obtain the centering towers.

Of course, the proposed procedure for performing the burn-in test (or more generally, any other test process requiring the thermal conditioning of the electronic devices under test) is merely illustrative, and it is not to be interpreted in a limitative manner.

The invention claimed is:

1. A test system for testing electronic devices each one having a case with a plurality of terminals, the test system including:

a set of test boards, wherein each test board includes a plurality of banks of electrically conductive receptacles each one for resting a corresponding electronic device, each receptacle being adapted to receive a terminal of the corresponding electronic device, a loader/unloader for releasing each electronic device with the terminals facing downwards on the corresponding bank of receptacles, the electronic device freely resting on the bank of receptacles without any mechanical lock, a set of boxes arranged in operation above the test boards to define a set of corresponding expandable chambers for a conditioning fluid, each box including a rigid body, a flexible membrane of a thermally conductive material facing the test boards, an inlet, and an outlet, means for controlling a temperature of the conditioning fluid, and means for forcing the conditioning fluid to circulate under pressure through the chambers to expand the flexible membranes downwardly, the expanded flexible membranes pressing the electronic devices freely resting on the corresponding banks of receptacles against the test boards to lock the electronic devices mechanically on the test boards and to condition the electronic devices thermally.

2. The test system according to claim 1, wherein each box further includes distribution means for increasing a uniformity of the circulation of the conditioning fluid through the chamber.

3. The test system according to claim 2, wherein the distribution means includes a plurality of obstacle elements for the conditioning fluid, the obstacle elements having a concentration decreasing moving away from an axis between the inlet and the outlet.

4. The test system according to claim 1, wherein in each box the membrane is fastened to the rigid body along a border thereof, the box further including holding means for holding the membrane integral with the rigid body in a plurality of internal points within the border.

5. The test system according to claim 4, wherein the rigid body has a bottom surface opposite the membrane, the distribution means and the holding means including a plurality of pins extending between the bottom surface and the membrane.

6. The test system according to claim 1, wherein each terminal ends with a convex contact region, each receptacle including a concave recess matching the convex contact region of the corresponding terminal and being made of an elastic material adapted to deform elastically in response to the pressing.

7. The test system according to claim 1, wherein each test board further includes centering means for each bank of receptacles, the centering means being adapted to interfere with the case of the corresponding electronic device for aligning each terminal thereof with the corresponding receptacle.

8. The test system according to claim 1, wherein the loader/unloader includes means for decoupling the test boards from the boxes, means for picking-up the electronic devices to be tested from a shipping tray and releasing the electronic devices on the test boards when decoupled from the boxes, means for coupling the test boards having the electronic devices resting thereon with the boxes, means for testing the electronic devices resting on the test boards when coupled with the boxes, and means for picking-up the electronic devices being tested from the test boards when decoupled from the boxes and releasing the electronic devices on the shipping tray.

9. A test board for use in the test system according to claim 1, the test board having no socket for locking the electronic devices mechanically on the test board.

10. A test method for testing electronic devices each one having a case with a plurality of terminals, the method including the steps of:

providing a set of test boards, wherein each test board includes a plurality of banks of electrically conductive receptacles each one for a corresponding electronic device, each receptacle being adapted to receive a terminal of the corresponding electronic device, releasing each electronic device with the terminals facing downwards on the corresponding bank of receptacles, the electronic device freely resting on the bank of receptacles without any mechanical lock, arranging a set of boxes above the test boards to define a set of corresponding expandable chambers for a conditioning fluid, each box including a rigid body, a flexible membrane of a thermally conductive material facing the test boards, an inlet, and an outlet, controlling a temperature of the conditioning fluid, and forcing the conditioning fluid to circulate under pressure through the chambers to expand the flexible membranes downwardly, the expanded flexible membranes pressing the electronic devices freely resting on the corresponding banks of receptacles against the test boards to lock the electronic devices mechanically on the test boards and to condition the electronic devices thermally.

11. The test method according to claim 10, further including the steps of:

decoupling the test boards from the boxes, picking-up the electronic devices to be tested from a shipping tray and releasing the electronic devices on the test boards, coupling the test boards having the electronic devices resting thereon with the boxes, testing the electronic devices resting on the test boards, decoupling the test boards from the boxes, picking-up the electronic devices being tested from the test boards and releasing the electronic devices on the shipping tray.

12. A manufacturing process for manufacturing the test board according to claim 9, the process including the steps of:

forming a plurality of isles for each bank of receptacles on a substrate, the isles being made of an electrically conductive and deformable material, pressing a forming tool including a plurality of forming elements corresponding to the terminals of at least one of the electronic devices against the isles for deforming the isles according to the forming elements, and hardening the isles to obtain the corresponding receptacles.

13. The process according to claim 12, further including the step of:

arranging restraining means around each isle to limit an enlargement thereof during the pressing.

14. The process according to claim 12, further including the steps of:

forming at least one column of a deformable further material for each bank of receptacles on the substrate, the at least one column being pressed in an inner portion by a border of a main body of the forming tool corresponding to the case of the at least one electronic device, and hardening the at least one column to obtain the corresponding centering means.

15. The test system according to claim 2, wherein in each box the membrane is fastened to the rigid body along a border thereof, the box further including holding means for holding the membrane integral with the rigid body in a plurality of internal points within the border.

16. The test system according to claim 3, wherein in each box the membrane is fastened to the rigid body along a border thereof, the box further including holding means for holding the membrane integral with the rigid body in a plurality of internal points within the border.

17. The test system according to claim 2, wherein each terminal ends with a convex contact region, each receptacle including a concave recess matching the convex contact region of the corresponding terminal and being made of an elastic material adapted to deform elastically in response to the pressing.

18. The test system according to claim 3, wherein each terminal ends with a convex contact region, each receptacle including a concave recess matching the convex contact region of the corresponding terminal and being made of an elastic material adapted to deform elastically in response to the pressing.

19. The test system according to claim 4, wherein each terminal ends with a convex contact region, each receptacle including a concave recess matching the convex contact region of the corresponding terminal and being made of an elastic material adapted to deform elastically in response to the pressing.

20. The test system according to claim 5, wherein each terminal ends with a convex contact region, each receptacle including a concave recess matching the convex contact region of the corresponding terminal and being made of an elastic material adapted to deform elastically in response to the pressing.

* * * * *